United States Patent
Kishii et al.

(10) Patent No.: US 8,289,075 B2
(45) Date of Patent: Oct. 16, 2012

(54) CLASS-D AMPLIFIER

(75) Inventors: Tatsuya Kishii, Iwata (JP); Moritaka Iyoda, Hamamatsu (JP); Hirotoshi Tsuchiya, Fukuroi (JP); Toshio Maejima, Iwata (JP); Masayoshi Nakamura, Nagaokakyo (JP); Masato Miyazaki, Hamamatsu (JP); Akihisa Himeno, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/807,759

(22) Filed: Sep. 14, 2010

(65) Prior Publication Data
US 2011/0063027 A1 Mar. 17, 2011

(30) Foreign Application Priority Data
Sep. 15, 2009 (JP) ................................. 2009-213806

(51) Int. Cl.
*H03F 1/14* (2006.01)
*H03F 3/217* (2006.01)
(52) U.S. Cl. ....................... 330/51; 330/207 A
(58) Field of Classification Search .............. 330/207 A, 330/251
See application file for complete search history.

(56) References Cited

U.S. PATENT DOCUMENTS

| | | | |
|---|---|---|---|
| 7,088,177 B2 * | 8/2006 | Lind | 330/207 A |
| 7,482,870 B2 | 1/2009 | Maejima et al. | |
| 8,040,184 B2 * | 10/2011 | Tsuchiya | 330/251 |

FOREIGN PATENT DOCUMENTS
JP 2007124624 A 5/2007

OTHER PUBLICATIONS

Korean Intellectual Property Office, "Notice of Preliminary Rejection" Patent Application No. 10-2010-0090497 of Yamaha Corporation; Mailing Date: Jul. 29, 2011; 3 pages.

* cited by examiner

*Primary Examiner* — Steven J Mottola
(74) *Attorney, Agent, or Firm* — Pillsbury Winthrop Shaw Pittman LLP

(57) ABSTRACT

A class-D amplifier for generating from an input signal a digital signal for driving a load, includes an output limit instruction generating section that detects that the digital signal falls outside a limit range and that outputs an output limit instruction signal, an attenuation instruction pulse generating section that includes an integrator for integrating the output limit instruction signal and that outputs a periodical attenuation instruction pulse having pulse width corresponding to an integrated value in the integrator, an attenuating section provided in an input path for the input signal and that attenuates the input signal based on the attenuation instruction pulse, and a mute control section that controls the integrated value in the integrator independently of the output limit instruction signal to control an amount of the attenuation of the attenuating section applied to the input signal.

7 Claims, 10 Drawing Sheets

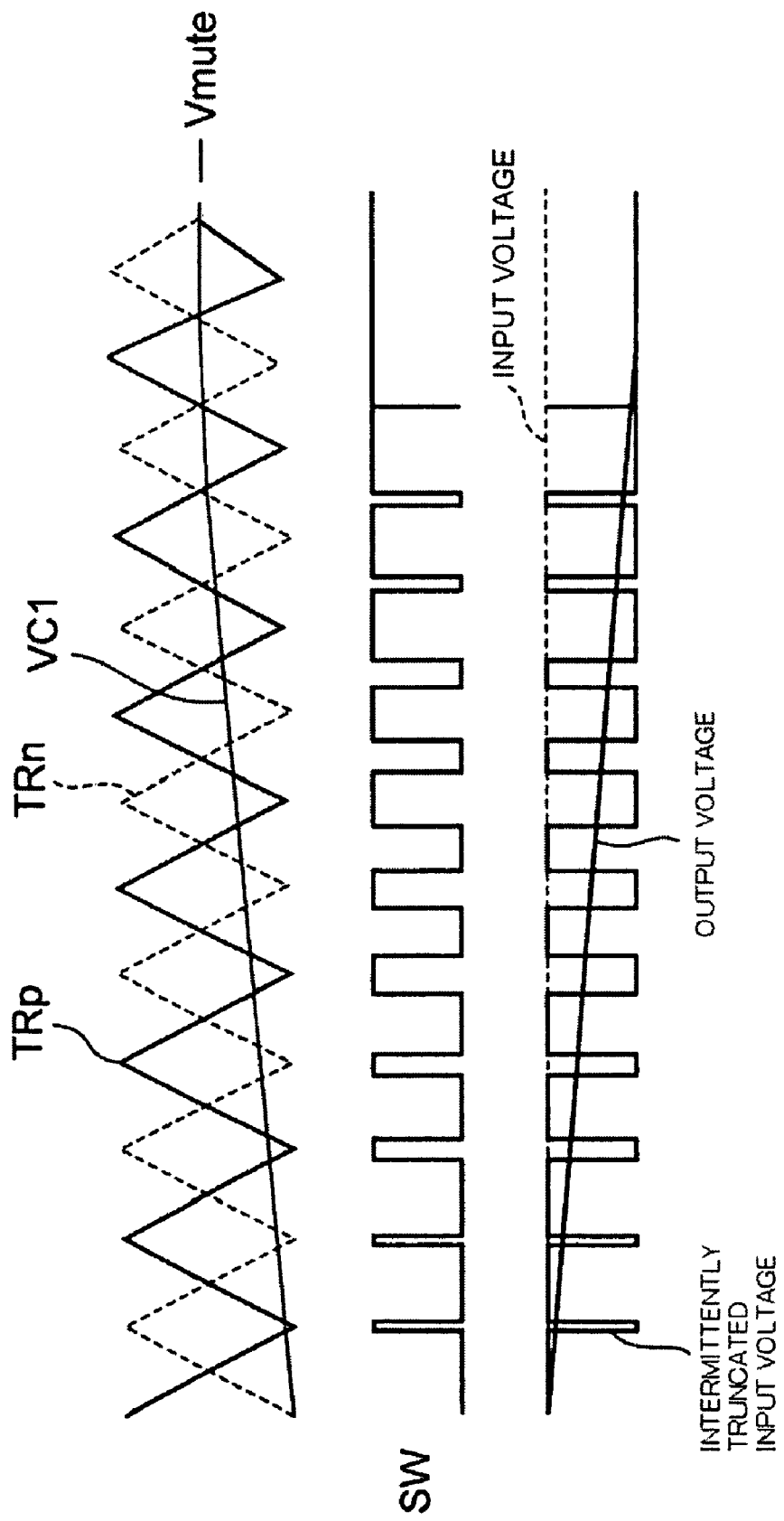

CLASS-D AMPLIFIER

BACKGROUND

The present invention relates to a class-D amplifier suitable for a power amplifier in audio equipment or the like.

A class-D amplifier is an amplifier for generating a pulse train having a pulse width modulated in correspondence to an input signal, so that the pulse train drives a load. In many cases, such a class-D amplifier is employed as a power amplifier for driving a speaker in audio equipment or the like. A class-D amplifier of this kind is disclosed in JP-A-2007-124624.

Meanwhile, in audio equipment equipped with a class-D amplifier, a mute function is necessary in some cases. In the prior art, in order that such a requirement should be satisfied, an attenuation circuit or a volume circuit implemented by an operational amplifier has been provided in the input section of the class-D amplifier so that a mute function has been realized. Nevertheless, such an attenuation circuit or a volume circuit causes an increase in the circuit size and in the cost of the class-D amplifier. Further, another problem has been caused that the attenuation circuit or the volume circuit need be controlled in the class-D amplifier and hence the control becomes complicated.

SUMMARY

The invention has been devised in view of such situations. An object of the invention is to provide a class-D amplifier for realizing a mute function without an increase in the circuit size and complexity.

In order to achieve the above object, according to the present invention, there is provided a class-D amplifier for generating from an input signal a digital signal for driving a load, comprising:

an output limit instruction generating section that detects that the digital signal falls outside a limit range and that outputs an output limit instruction signal;

an attenuation instruction pulse generating section that includes an integrator for integrating the output limit instruction signal and that outputs a periodical attenuation instruction pulse having pulse width corresponding to an integrated value in the integrator;

an attenuating section provided in an input path for the input signal and that attenuates the input signal based on the attenuation instruction pulse; and a mute control section that controls the integrated value in the integrator independently of the output limit instruction signal to control an amount of the attenuation of the attenuating section applied to the input signal.

Preferably, when a mute instruction is input to the mute control section, the mute control section increases the integrated value in the integrator gradually.

Preferably, when a mute release instruction is input to the mute control section after the mute instruction has been input thereto, the mute control section decreases the integrated value in the integrator gradually.

Preferably, the mute control section includes a signal absence detecting section, and the signal absence detecting section increases the integrated value in the integrator when an amplitude of the input signal is equal to or smaller than a predetermined level.

Preferably, the mute control section includes a signal absence detecting section, and the signal absence detecting section outputs to the attenuating section a command signal for controlling the amount of the attenuation of the attenuating section applied to the input signal, when an amplitude of the input signal is equal to or smaller than a predetermined level.

According to the present invention, there is also provided a class-D amplifier for generating from an input signal a digital signal for driving a load, comprising:

a detecting section that detects an amplitude of the input signal;

a signal absence detecting section that outputs an attenuation instruction signal when the amplitude of the input signal is equal to or smaller than a predetermined level; and an attenuating section provided in an input path for the input signal and that attenuates the input signal based on the attenuation instruction signal.

BRIEF DESCRIPTION OF THE DRAWINGS

The above objects and advantages of the present invention will become more apparent by describing in detail preferred exemplary embodiments thereof with reference to the accompanying drawings, wherein:

FIG. 6 is a diagram showing signal waveforms in various sections at the time of muting operation according to the first embodiment of the invention;

DETAILED DESCRIPTION OF EXEMPLARY EMBODIMENTS

Embodiments of the invention are described below with reference to the drawings.

First Embodiment

Figure 1:
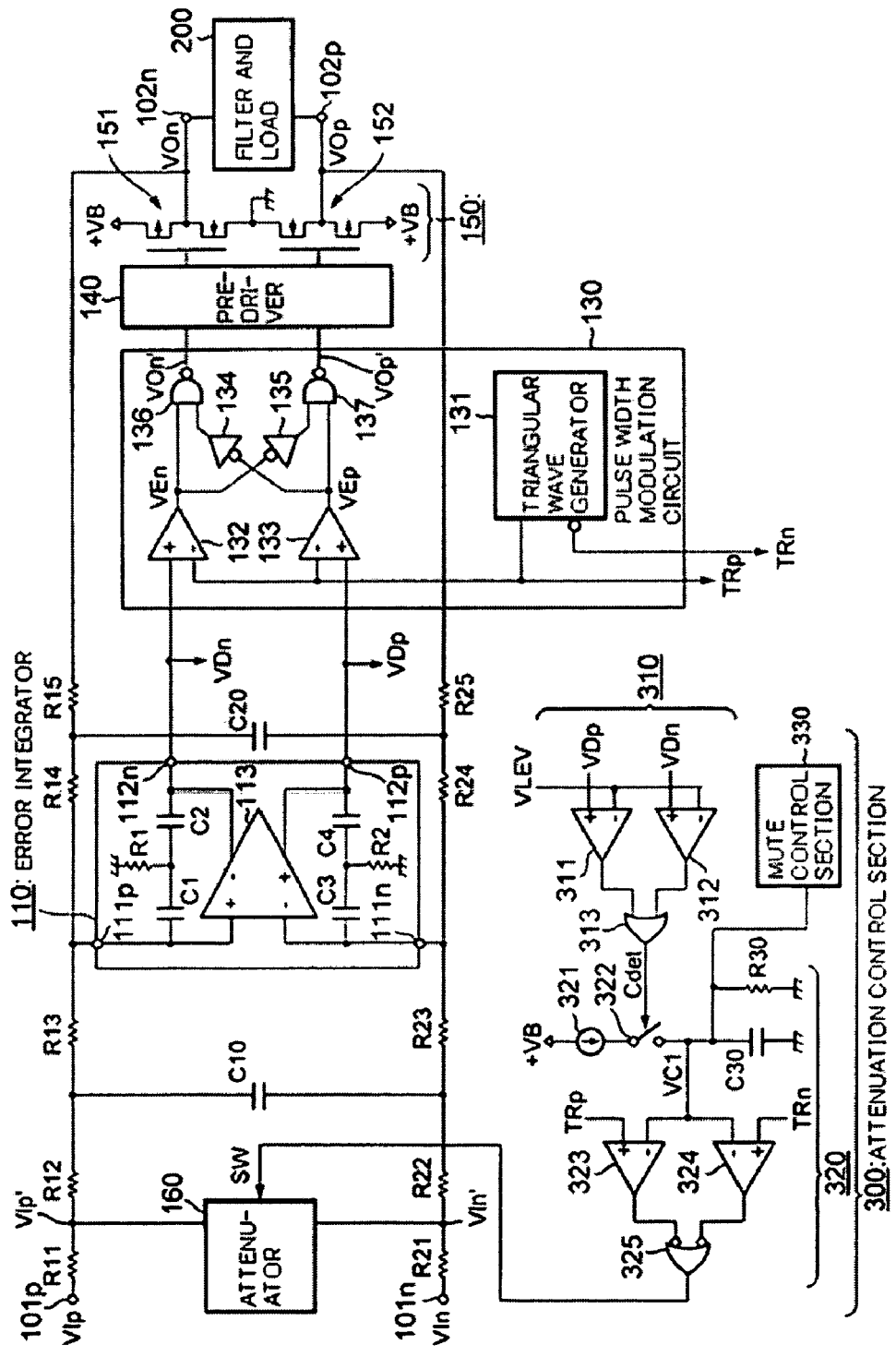
FIG. 1 is a circuit diagram showing a configuration of a class-D amplifier according to a first embodiment of the invention.

FIG. 1 is a circuit diagram showing a configuration of a class-D amplifier according to a first embodiment of the invention. The class-D amplifier generates output digital signals VOp and VOn in two phases of positive and negative subjected to pulse width modulation in accordance with the levels of input analog signals VIp and VIn in two phases of positive and negative which are input to input ends 101p and 101n, respectively, and then outputs the obtained signals through output ends 102p and 102n, respectively. Here, a filter and a load 200 such as a speaker coil are provided between the output ends 102p and 102n. Further, resistors R11, R12, R13, R14, and R15 connected in series are provided between the input end 101p and the output end 102n, while resistors R21, R22, R23, R24, and R25 connected in series are provided between the input end 101n and the output end 102p. The resistance values of these resistors are such that R11=R21, R12=R22, R13=R23, R14=R24, and R15=R25.

A positive phase input end 111p of an error integrator 110 receives the input analog signal VIp of positive phase through the resistors R11, R12, and R13. A negative phase input end 111n of the error integrator 110 receives the input analog signal VIn of the negative phase through the resistors R21, R22, and R23. Further, a negative phase output digital signal VOn is fed back through the resistors R15 and R14 to the positive phase input end 111p of the error integrator 110, while a positive phase output digital signal VOp is fed back through the resistors R25 and R24 to the negative phase input end 111n of the error integrator 110. Then, the error integrator 110 integrates the errors between the input analog signal VIp or VIn and the output digital signal VOp or VOn, and then outputs integrated value signals VDp and VDn in two phases of positive and negative indicating the integration results through the positive phase output end 112p and the negative phase output end 112n.

In the input paths for the input analog signals VIp and VIn to the error integrator 110, a capacitor C10 is provided between a common connection point of the resistors R12 and R13 and a common connection point of the resistors R22 and R23. The input path where the capacitor C10 is provided serves as a low pass filter for removing high-frequency noise from the input signals in the course that the input analog signals VIp and VIn are input to the error integrator 110.

Further, in the input paths for the input analog signals VIp and VIn to the error integrator 110, an attenuator 160 is provided between a common connection point of the resistors R11 and R12 and a common connection point of the resistors R21 and R22. The attenuator 160 serves as a unit for attenuating the levels of the input signals input to the error integrator 110. The attenuator 160 according to this embodiment is a switch configured by a MOSFET (Field Effect Transistor having a Metal-Oxide-Semiconductor structure; referred to as a transistor, hereinafter) or the like. The attenuator 160 becomes ON state only during each period when the attenuation instruction pulse SW is at an active level (an H level in the attenuation instruction pulse SW), and hence serves as an attenuating unit for intermittently attenuating the input analog signal. Here, a unit for generating the attenuation instruction pulse SW is described later.

A circuit of diverse kind may be employed as the error integrator 110. In the example shown in FIG. 1, an error integrator of second order is employed as the error integrator 110 configured by a differential amplifier 113, four capacitors C1 to C4, and two resistors R1 and R2. Here, the positive phase input end ("+" input end) and the negative phase input end ("−" input end) of the differential amplifier 113 serve also as the positive phase input end 111p and the negative phase input end 111n of the error integrator 110, respectively. Further, the positive phase output end ("+" output end) and the negative phase output end ("−" output end) of the differential amplifier 113 serve also as the positive phase output end 112p and the negative phase output end 112n of the error integrator 110, respectively. Furthermore, the capacitors C1 and C2 for integrating the error are connected in series and provided between the positive phase input end and the negative phase output end of the differential amplifier 113. Then, a common connection point of these capacitors is grounded through the resistor R1. Further, the capacitors C3 and C4 for integrating the error are connected in series and provided between the negative phase input end and the positive phase output end of the differential amplifier 113. Then, a common connection point of these capacitors is grounded through the resistor R2.

A pulse width modulation circuit 130 generates pulses VOp' and VOn' in two phases having a pulse width corresponding to the levels of the integrated value signals VDp and VDn output from the error integrator 110. More specifically, when VDp>VDn, the pulse width modulation circuit 130 outputs negative pulses VOp' having a pulse width corresponding to the level difference VDp−VDn. Further, when VDn>VDp, the pulse width modulation circuit 130 outputs negative pulses VOn' having a pulse width corresponding to the level difference VDn−VDp. Here, an exemplary detailed configuration of the pulse width modulation circuit 130 is described later.

The predriver 140 transmits the pulses VOp' and VOn' output by the pulse width modulation circuit 130 to the output buffer 150, and is configured by a non-inverting buffer or the like. The output buffer 150 has an inverter 151 and an inverter 152. As shown in FIG. 1, the inverters 151 and 152 are a known inverter in which a P-channel transistor and an N-channel transistor connected in series are provided between the power supply +VB and the ground. Here, the inverter 151 inverts the level of the pulses VOn' output from the pulse width modulation circuit 130 via the predriver 140, and then outputs the obtained pulses as the output digital signal VOn through the output end 102n. Further, the inverter 152 inverts the level of the pulses VOp' output from the pulse width modulation circuit 130 via the predriver 140, and then outputs the obtained pulses as the output digital signal VOp through the output end 102p.

In the feedback paths for the output digital signals VOp and VOn from the output buffer 150 to the error integrator 110, a capacitor C20 is provided between a common connection point of the resistors R15 and R14 and a common connection point of the resistors R25 and R24. The feedback path where the capacitor C20 is inserted serves as a low pass filter for removing high-frequency noise from the feedback signals in the course that the output digital signals VOp and VOn are fed back to the error integrator 110.

Figure 2:
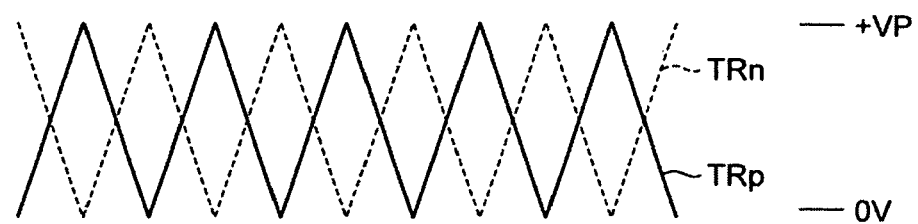
FIG. 2 is a diagram showing waveforms of triangular wave signals according to the first embodiment of the invention.
Figure 3A:
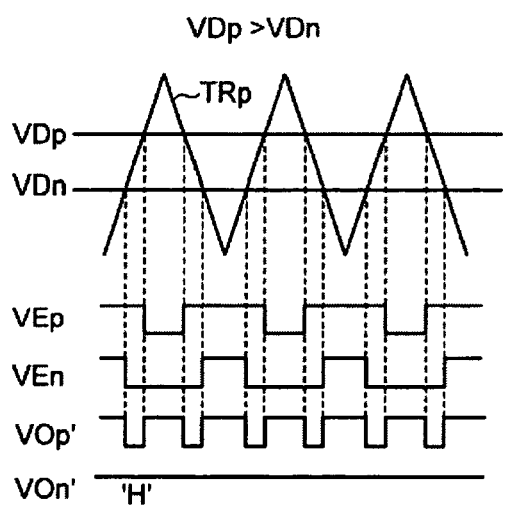
FIGS. 3A and 3B are diagrams showing signal waveforms in various sections of a pulse width modulation circuit 130 according to the first embodiment of the invention.
Figure 3B:
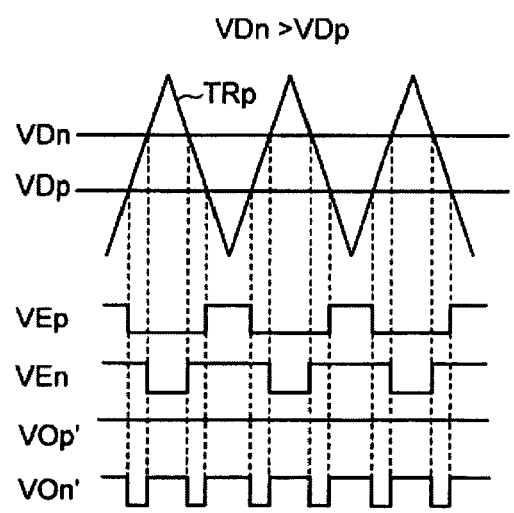

An exemplary configuration of the pulse width modulation circuit 130 is described below. In the example shown in FIG. 1, the pulse width modulation circuit 130 includes a triangular wave generator 131, comparators 132 and 133, inverters 134 and 135, and NAND gates 136 and 137. FIG. 2 is a diagram showing the waveforms of the triangular wave signals TRp and TRn generated by the triangular wave generator 131. Further, FIGS. 3A and 3B are diagrams showing signal waveforms in various sections of the pulse width modulation circuit 130. FIG. 3A shows signal waveforms generated when VDp>VDn, while FIG. 3B shows signal waveforms generated when VDn>VDp.

As shown in FIG. 2, the triangular wave generator 131 generates: a triangular wave signal TRp of constant period that rises from a voltage of 0 V to a predetermined voltage of +VP at a fixed slope and then falls from the voltage +VP to the voltage 0 V at a fixed slope; and a triangular wave signal TRn having a negative phase relative to the triangular wave signal TRp. Here, the voltage +VP may be the same voltage as the power supply +VB, or alternatively may be a different voltage.

As shown in FIGS. 3A and 3B, the comparator 132 compares the triangular wave signal TRp with the integrated value signal VDn, and then outputs a signal VEn of an L level during each period when the triangular wave signal TRp exceeds the integrated value signal VDn and outputs the signal VEn of an H level during other period. The comparator 133 compares the triangular wave signal TRp with the integrated value signal VDp, and then outputs a signal VEp of an L level during each period when the triangular wave signal TRp exceeds the integrated value signal VDp and outputs the signal VEp of an H level during other period. The inverter 134 outputs a signal obtained by inverting the level of the signal VEp. The inverter 135 outputs a signal obtained by inverting the level of the signal VEn.

The NAND gate 136 calculates a logical product between the signal VEn and the output signal of the inverter 134 so as to generate the pulses VOn'.

Here, the signal VEn is at an H level during each period when the triangular wave signal TRp does not exceed the integrated value signal VDn. Further, the output signal of the inverter 134 is at an H level during each period when the triangular wave signal TRp exceeds the integrated value signal VDp. Thus, in the case of VDn>VDp as shown in FIG. 3B, the NAND gate 136 outputs negative pulses VOn' of an L level only during each period when the signal value of the triangular wave signal TRp falls between VDn and VDp. That is, in the case of VDn>VDp, the NAND gate 136 outputs the pulses VOn' having a pulse width proportional to the level difference VDn−VDp.

Further, the NAND gate 137 calculates a logical product between the signal VEp and the output signal of the inverter 135 so as to generate the pulses VOp'. Here, the signal VEp is at an H level during each period when the triangular wave signal TRp does not exceed the integrated value signal VDp. Further, the output signal of the inverter 135 is at an H level during each period when the triangular wave signal TRp exceeds the integrated value signal VDn. Thus, in the case of VDp>VDn as shown in FIG. 3A, the NAND gate 137 outputs negative pulses VOp' of an L level only during each period when the signal value of the triangular wave signal TRp falls between VDn and VDp. That is, in the case of VDp>VDn, the NAND gate 137 outputs the pulses VOp' having a pulse width proportional to the level difference VDp−VDn.

Description of details of the pulse width modulation circuit 130 is completed here.

The configuration of an attenuation control section 300 is described below. The attenuation control section 300 has an output limit instruction generating section 310, an attenuation instruction pulse generating section 320, and a mute control section 330. The output limit instruction generating section 310 detects that the output digital signals VOp and VOn fall outside a particular limit range, and then outputs an output limit instruction signal Cdet. Specifically, the output limit instruction generating section 310 according to this embodiment detects that the output digital signals VOp and VOn becomes a clipped state or a state close to the clipped state.

In the output limit instruction generating section 310, the comparator 311 compares the integrated value signal VDp of the error integrator 110 with a reference level VLEV, and then outputs a signal of H level when the integrated value signal VDp exceeds the reference level VLEV. Further, the comparator 312 compares the integrated value signal VDn of the error integrator 110 with the reference level VLEV, and then outputs a signal of H level when the integrated value signal VDn exceeds the reference level VLEV. Here, the reference level VLEV has a voltage value equal to or slightly lower than the upper peak voltage of the triangular wave signal TR. When the output signal of the comparator 311 or alternatively the output signal of the comparator 312 is at an H level, the OR gate 313 brings the output limit instruction signal Cdet to an H level serving as an active level.

The attenuation instruction pulse generating section 320 has an integrator for integrating the output limit instruction signal Cdet and outputs periodic attenuation instruction pulses SW having a pulse width corresponding to the integrated value in the integrator. The attenuation instruction pulse generating section 320 includes a constant current source 321, a switch 322, and a capacitor C30 serving as an integrator which are connected in series and provided between the power supply +VB and the ground; a resistor R30 connected in parallel to the capacitor C30; comparators 323 and 324; and a low-active OR gate 325.

An output limit instruction signal Cdet is supplied to the switch 322. Here, when the output limit instruction signal Cdet is at an H level, the switch 322 is ON and hence the capacitor C30 is charged with the output current from the constant current source 321. Further, the resistor R30 causes discharge of the charge accumulated on the capacitor C30. In the comparator 323, the positive phase input end receives the triangular wave signal TRp, and the negative phase input end receives the voltage VC1 on the capacitor C30. Then, during each period when the triangular wave signal TRp is lower than the voltage VC1 on the capacitor C30, a signal of L level is output to the low-active OR gate 325. Further, in the comparator 324, the positive phase input end receives the triangular wave signal TRn, and the negative phase input end receives the voltage VC1 on the capacitor C30. Then, during each period when the triangular wave signal TRn is lower than the voltage VC1 on the capacitor C30, a signal of L level is output to the low-active OR gate 325. Thus, during each period when the triangular wave signal TRp is lower than the voltage VC1 on the capacitor C30 and during each period when the triangular wave signal TRn is lower than the voltage VC1 on the capacitor C30, the low-active OR gate 325 generates an attenuation instruction pulse SW of H level. This attenuation instruction pulse SW is supplied to the attenuator 160 so as to turn ON the attenuator 160 serving a switch.

When receiving a mute instruction, the mute control section 330 gradually increases the integrated value in the integrator, that is, the voltage VC1 on the capacitor C30, toward a predetermined mute voltage Vmute. Then, after having received the mute instruction, when receiving a mute release instruction, the mute control section 330 gradually decreases the voltage VC1 on the capacitor C30. Here, the mute voltage Vmute is equal to the voltage VC1 on the capacitor C30 obtained when the pulse width of the attenuation instruction pulse SW becomes the maximum (that is, the voltage VC1 that causes the attenuation instruction pulse SW to maintain always at an H level). The mute instruction is generated, for example, when the class-D amplifier becomes a power-down state so that the supply voltage VB falls or alternatively when mute is instructed by operation of an operation element provided in the audio equipment employing the class-D amplifier. Further, the mute release instruction is generated, for example, when a predetermined time has elapsed after the class-D amplifier has recovered from the power-down state to a normal state so that the supply voltage VB is restored or alternatively when mute release is instructed by operation of the operation element provided in the audio equipment employing the class-D amplifier.

Figure 4:
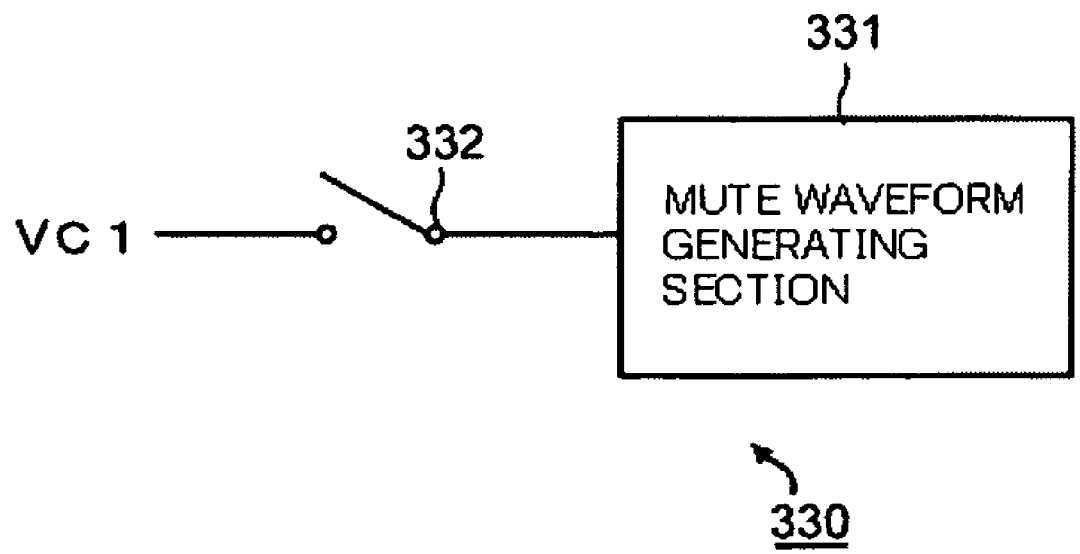
FIG. 4 is a circuit diagram showing an exemplary configuration of a mute control section 330 according to the first embodiment of the invention.

FIG. 4 is a block diagram showing an exemplary configuration of the mute control section 330. The mute control section 330 has: a mute waveform generating section 331; and a switch 332 provided between the mute waveform generating section 331 and the capacitor C30. When receiving the mute instruction, the mute control section 330 controls to turn ON the switch 332. Then, the mute waveform generating section 331 controls to rise the voltage VC1 on the capacitor C30 from 0 V to the mute voltage Vmute gradually in a certain time. The capacitor C30 is connected to the mute waveform generating section 331 through the switch 332. Further, when receiving the mute release instruction, the mute waveform generating section 331 controls to fall the voltage VC1 on the capacitor C30 from a voltage value at the time to 0 V gradually in a certain time. Further, after the mute waveform generating section 331 controls to fall the voltage VC1 into 0 V, the mute control section 330 turns OFF the switch 332.

Description of details of the configuration of the class-D amplifier according to this embodiment is completed here.

The operation in this embodiment is described below. In this embodiment, the triangular wave signals TRp and TRn vary within the range from 0 V to +VP. Then, in order that the output digital signals VOp and VOn should be obtained as pulse trains without occurrence of clipping, the two integrated value signals VDp and VDn of the error integrator 110 need fall within the range where intersection occurs with the triangular wave signals TRp and TRn (the range from 0 V to +VP). Here, when the amplitudes of the input analog signals VIp and VIn fall within a particular appropriate range, the integrated value signals VDp and VDn of the error integrator 110 fall within the range for the amplitude of the triangular wave signal TR. In contrast, when input analog signals VIp and VIn having a large amplitude falling outside such an appropriate range are applied to the class-D amplifier, if certain appropriate countermeasure were not employed, the integrated value signal VDp or VDn of the error integrator 110 would go outside the range for the amplitude of the triangular wave signal TR (the range from 0 V to +VP) and hence a clipped state would occur in which the output digital signal VOp or VOn would be maintained at an H level continuously. However, according to this embodiment, the attenuation control section 300 avoids such occurrence of clipping. This operation is described below with reference to FIGS. 5A and 5B. Here, in the present description, the appropriate range for the amplitudes of the input analog signals VIp and VIn indicates a range that does not cause clipping in the output digital signals VOp and VOn, which is a range smaller than a value obtained by dividing one half of the supply voltage for the output buffer 150 of the class-D amplifier by the amplification factor of the class-D amplifier.

Figure 5A:
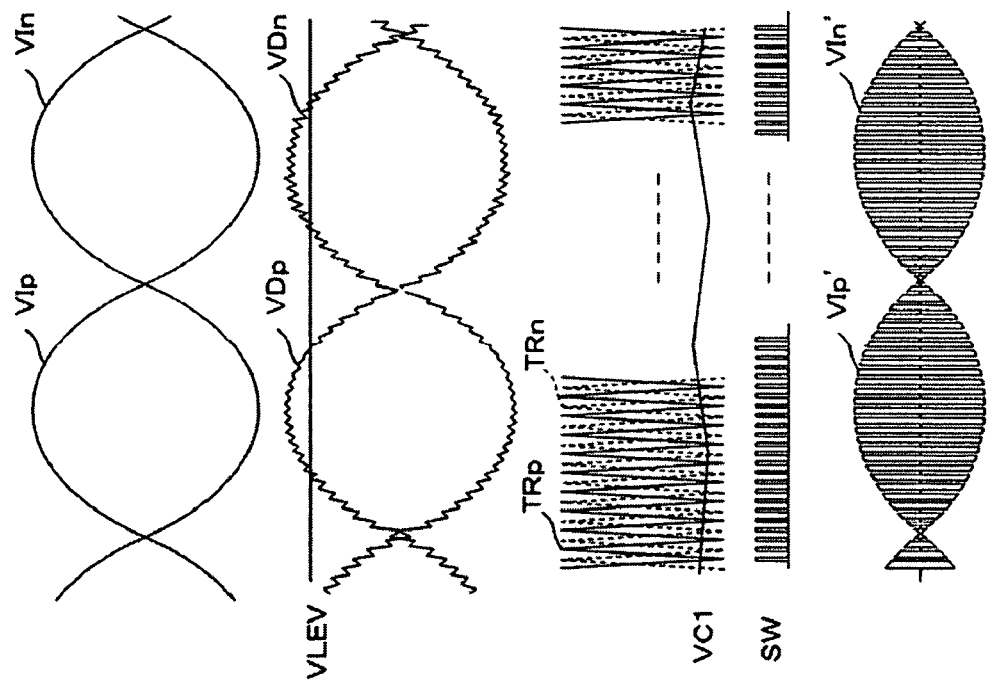
FIGS. 5A and 5B are diagrams showing signal waveforms in various sections according to the first embodiment of the invention.

First, as shown in FIG. 5A, when the amplitudes of the input analog signals VIp and VIn fall within the appropriate range and hence the maximum values of the integrated value signals VDp and VDn of the error integrator 110 do not reach the reference level VLEV, the output limit instruction generating section 310 causes the output limit instruction signal Cdet to be at an L level. Thus, in the attenuation instruction pulse generating section 320, the switch 322 is turned OFF and hence the voltage VC1 on the capacitor C30 serving as an integrator goes to 0 V. Accordingly, the triangular wave signals TRp and TRn do not intersect the voltage VC1, and hence the attenuation instruction pulses SW are maintained continuously at an L level serving as an inactive level. Thus, the attenuator 160 remains continuously OFF. As a result, as shown in the figure, the analog signals VIp' and VIn' at the two ends of the attenuator 160 have waveforms of similarity to those of the input analog signals VIp and VIn.

Figure 5B:
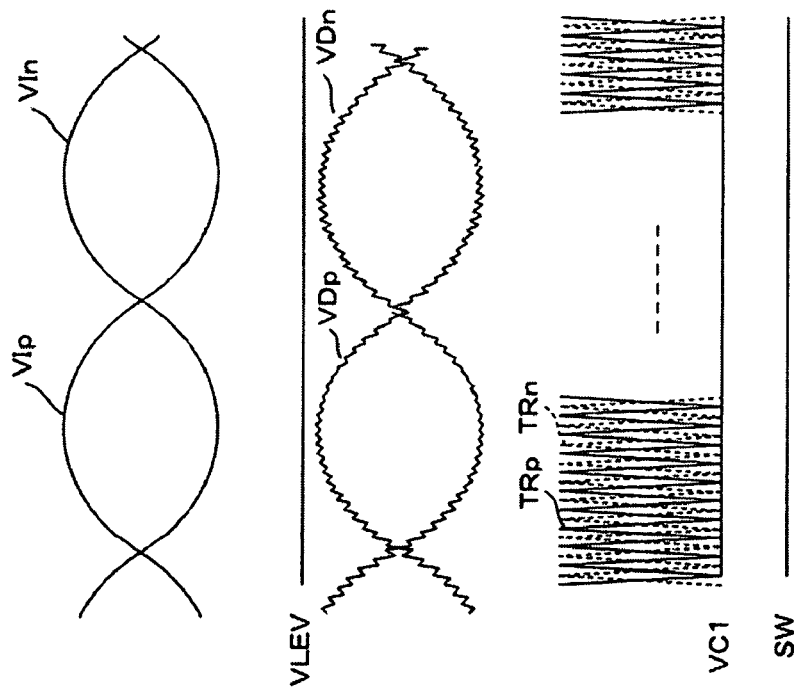

In contrast, as shown in FIG. 5B, when the amplitudes of the input analog signals VIp and VIn increase so that at least one of the integrated value signals VDp and VDn of the error integrator 110 exceeds the reference level VLEV, the output limit instruction generating section 310 causes the output limit instruction signal Cdet to be at an H level and the switch 322 to be ON during the period when the integrated value signal VDp or VDn is higher than the reference level VLEV. As a result, the constant current source 321 charges the capacitor C30 through the switch 322. The charging of the capacitor C30 is performed at each time that the integrated value signal VDp or VDn exceeds the reference level VLEV. Thus, pulsation is repeated such that when the integrated value signal VDp or VDn exceeds the reference level, the voltage VC1 on the capacitor C30 rises first and, after that, falls in accordance with discharging of the accumulated charge on the capacitor C20 through the resistor R30 until the integrated value signal VDp or VDn exceeds the reference level again. Then, the low-active OR gate 325 outputs the attenuation instruction pulses SW that become an H level (active level) during each period when the triangular wave signals TRp and TRn intersect the voltage VC1 and the triangular wave signal TRp is lower than the voltage VC1 and during each period when the triangular wave signal TRn is lower than the voltage VC1.

Here, the attenuator 160 (switch) becomes OFF during each period when the attenuation instruction pulse SW is at an L level, and becomes ON during each period at an H level. Thus, during each period when the attenuation instruction pulse SW is at an L level, the analog signals VIp' and VIn' at the two ends of the attenuator 160 (switch) have signal values corresponding to the original input analog signals VIp and VIn, respectively. In contrast, during each period when the attenuation instruction pulse SW is at an H level, the analog signals VIp' and VIn' are at 0 V. Thus, as shown in the figure, waveforms are obtained in which intermittent truncation is performed at fixed time intervals. Thus, the analog signals substantially input to the error integrator 110 are attenuated so that the levels of the output signals of the error integrator 110 are returned into the appropriate range between 0 V and +VP. This avoids the occurrence of clipping in the output digital signals VOp and VOn.

More specifically, in a situation that the amplitudes of the input analog signals VIp and VIn are large and hence such intermittent truncation is performed, when the amplitudes of the input analog signals VIp and VIn are to increase so that the amplitudes of the integrated value signals VDp and VDn of the error integrator 110 are to increase, control equivalent to negative feedback is performed in which the rate of intermittent truncation is increased so that the overall gain of the class-D amplifier is reduced. Such negative feedback control permits amplification of the input analog signals VIp and VIn without occurrence of distortion. Further, this permits the overall gain of the class-D amplifier to be adjusted into an optimum value such that when the input analog signals VIp and VIn reach the peak level, the pulse width modulation factor for the output digital signal VOp or VOn reaches a fixed upper limit. Thus, in a region where the amplitudes of the input analog signals VIp and VIn are large and hence fall outside the appropriate range, even when the amplitudes of the input analog signals VIp and VIn increase, distortion is avoided in the output signal waveforms supplied to the load (the waveforms have shapes obtained by integrating the output digital signals VOp and VOn). Further, the peak levels of the output signal waveforms are maintained at a constant value.

The upper limit for the pulse width modulation factor of the output digital signal VOp or VOn depends on the reference level VLEV. This is because in the class-D amplifier according to this embodiment, the pulse width modulation factor for the output digital signals VOp and VOn is determined in accordance with the levels of the integrated value signals VDp and VDn of the error integrator 110 and because when the integrated value signals VDp and VDn of the error integrator 110 exceed the reference level VLEV, a voltage VC1 at a level intersecting the triangular wave signals TRp and TRn is generated so that attenuation instruction pulses SW for intermittent truncation are generated so as to suppress an increase in the levels of the integrated value signals VDp and VDn of the error integrator 110 and an increase in the pulse width modulation factor associated with this.

In this embodiment, adjustment of the response characteristics of clipping is achieved by adjusting the capacitance of the capacitor C30 and the resistance of the resistor R30. In accordance with occurrence of clipping, when the attenuation instruction signal SW need be generated in a short time, this is achieved by reducing the capacitance of the capacitor C30. Further, after a clipped state is resolved, when the time elapsing until the attenuation instruction pulses SW are stopped need be increased, this is achieved by increasing the resistance of the resistor R30.

An operation at the time of mute and mute release according to this embodiment is described below. FIG. 6 is a diagram showing waveforms in various sections at the time of mute. When the mute control section 330 receives a mute instruction, the switch 332 is turned ON. Then, as shown in FIG. 6, the mute waveform generating section 331 of the mute control section 330 controls to rise the voltage VC1 on the capacitor C30 from 0 V to the mute voltage Vmute at a fixed time slope. Here, the mute voltage Vmute is at a level of the center between the upper and the lower peaks of the triangular wave signals TRp and TRn or more. When the voltage VC1 rises as such, the attenuation instruction pulses SW are generated in synchronization with the individual peak timings of the triangular wave signals TRp and TRn. Then, the pulse width of the attenuation instruction pulses SW increases with the rise of the voltage VC1. Here, the attenuator 160 is turned ON only during each period when the attenuation instruction pulse SW is at an H level, so that the input voltage to the error integrator 110 is truncated (thinned) intermittently. Accordingly, the time width of intermittent truncation for the input voltages in accordance with the rise of the voltage VC1. As a result, the output voltage of the class-D amplifier (the effective voltage supplied to the filter and load 200) is attenuated in accordance with the rise of the voltage VC1. Then, after the voltage VC1 reaches the mute voltage Vmute, the attenuation instruction pulse SW is continuously maintained at an H level. Thus, the input voltage to the error integrator 110 becomes 0 V, and so does the output voltage of the class-D amplifier.

After that, when a mute release instruction is provided, the mute waveform generating section 331 of the mute control section 330 controls to fall the voltage VC1 on the capacitor C30 from the mute voltage Vmute to 0 V gradually in a certain time. As such, operation reverse to that shown in FIG. 6 is performed. That is, in accordance with the fall of the voltage VC1, the pulse width of the attenuation instruction pulses SW is gradually reduced, and hence the time width of intermittent truncation for the input voltages is reduced. Thus, the output voltage of the class-D amplifier rises in accordance with the fall of the voltage VC1. Then, when the voltage VC1 reaches 0 V, the attenuation instruction pulse SW is continuously maintained at the zero level. Then, the class-D amplifier outputs voltages corresponding to the input analog signals VIp and VIn. Then, after the voltage VC1 falls to 0 V, the switch 332 is turned OFF in the mute control section 330.

Description of the operation of mute and mute release according to this embodiment is completed here.

As described above, according to this embodiment, a mute function is realized by employing the attenuation instruction pulse generating section 320 for prevention of clipping. Thus, according to this embodiment, the mute function is realized without an increase in the circuit size and in the control complexity.

Second Embodiment

Figure 7:
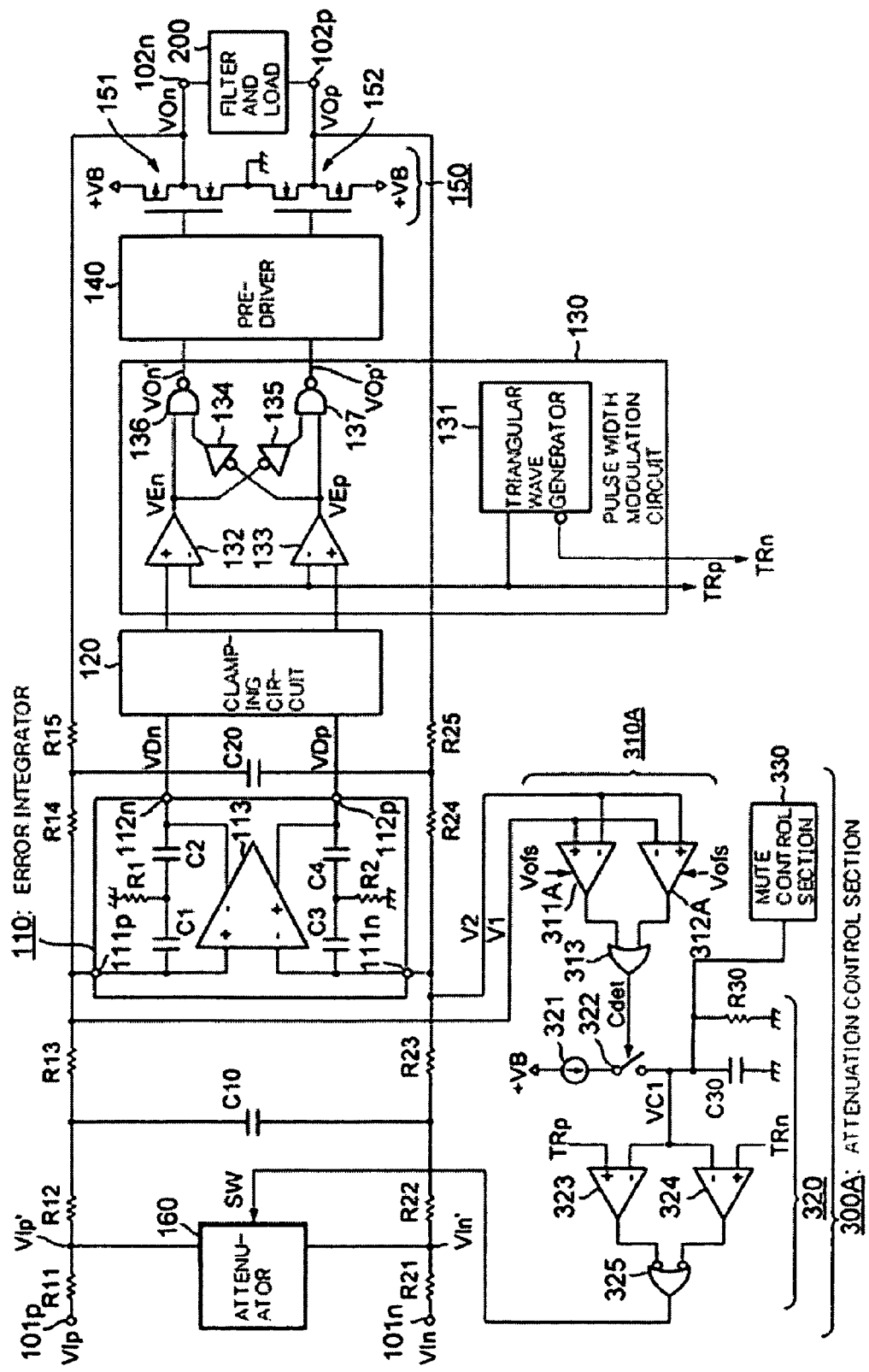
FIG. 7 is a circuit diagram showing a configuration of a class-D amplifier according to a second embodiment of the invention.

FIG. 7 is a circuit diagram showing a configuration of a class-D amplifier according to a second embodiment of the invention. Here, in this figure, same parts to those shown in FIG. 1 described above are designated by same numerals, and their description is omitted. The class-D amplifier according to this embodiment is provided with a circuit for realizing a power limit control function of limiting the output power to a range for the purpose of volume control or the like of a speaker serving as a load. Specifically, in the class-D amplifier according to this embodiment, a clamping circuit 120 is provided between the error integrator 110 and the pulse width modulation circuit 130.

The clamping circuit 120 serves as a circuit for clamping the integrated value signals VDp and VDn so as to limit the power values of the output digital signals VOp and VOn such that the integrated value signals VDp and VDn output from the error integrator 110 do not exceed an upper limit clamp level UL set up in advance or alternatively do not go below a lower limit clamp level LL set up in advance. Here, the upper limit clamp level UL and the lower limit clamp level LL are set up, for example, on the basis of an external setting signal generated in accordance with operation of an operation element (not shown) provided in a case accommodating the class-D amplifier or an external setting signal provided from an apparatus outside the class-D amplifier.

An attenuation control section 300A has a configuration that in the attenuation control section 300 according to the first embodiment, the output limit instruction generating section 310 is replaced by an output limit instruction generating section 310A. The output limit instruction generating section 310 according to the first embodiment detects the clipping of the output digital signals VOp and VOn and then outputs the output limit instruction signal Cdet. In contrast, the output limit instruction generating section 310A according to this embodiment detects that the clamping circuit 120 clamps the integrated value signals VDp and VDn, and then outputs an output limit instruction signal Cdet. That is, according to this embodiment, the expression "a digital signal falls outside a particular limit range" means that the power values of the output digital signals VOp and VOn exceed an upper power limit specified from the outside.

On the basis of the input level V1 of the positive phase input end 111$p$ and the input level V2 of the negative phase input end 111$n$ of the error integrator 110, the output limit instruction generating section 310A detects whether distortion of a certain amount occurs in the output waveforms from the class-D amplifier to the filter and the load 200 (referred to as load drive waveforms, hereinafter) by performing a clamping of the integrated value signal VDp or VDn by the clamping circuit 120. The principles of distortion detection performed by the output limit instruction generating section 310A are as follows.

Figure 8:
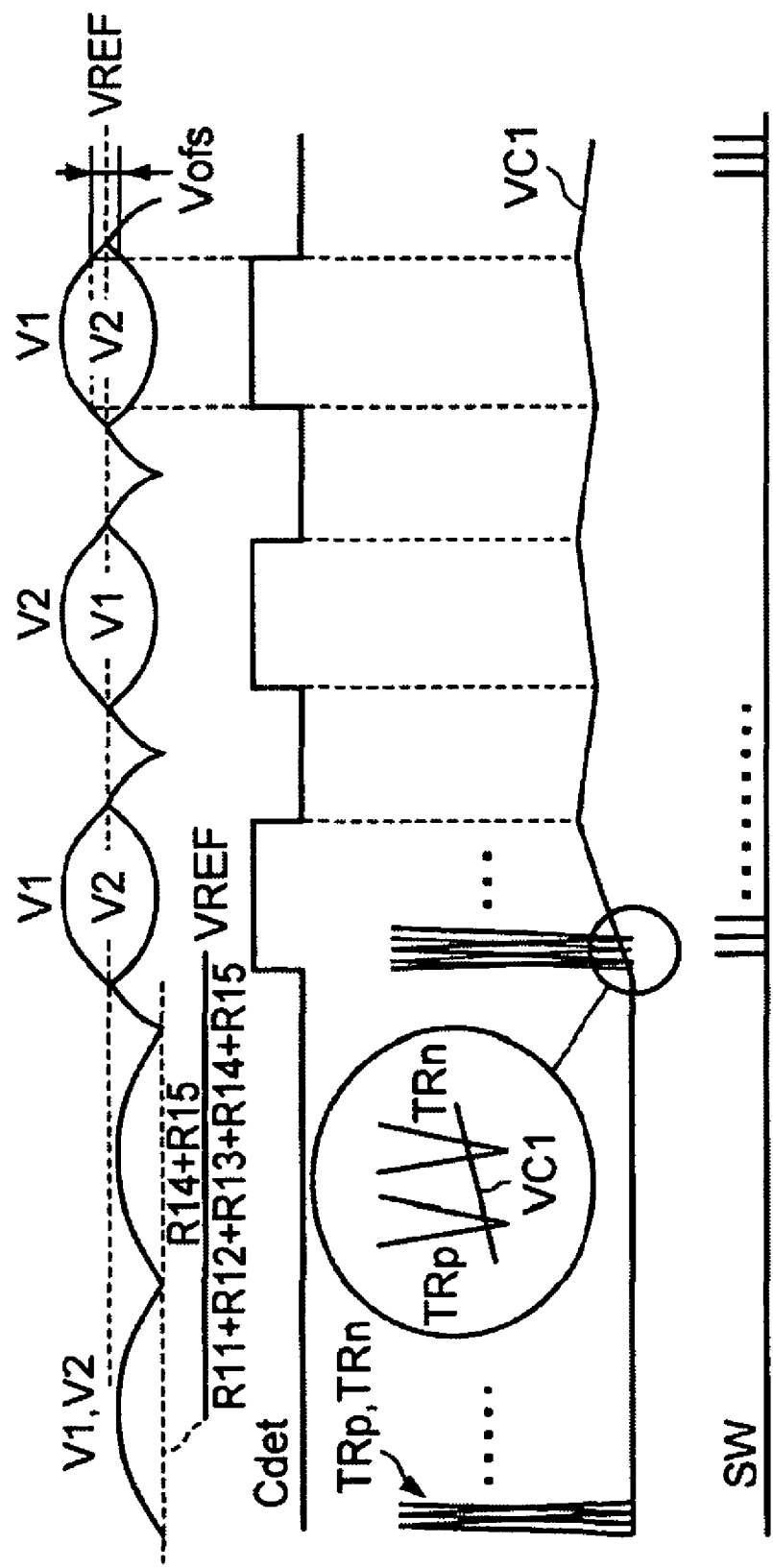
FIG. 8 is a diagram showing signal waveforms in various sections according to the second embodiment of the invention.

First, in a state that the integrated value signals VDp and VDn are not clamped by the clamping circuit 120, feedback signals having levels corresponding to the input signals to the error integrator 110 are fed from the output side (102n and 102p) to the input side of the error integrator 110. Thus, the error integrator 110 operates in a state that the input level V1 of the positive phase input end 111p and the input level V2 of the negative phase input end 111n are maintained at the same voltage. More specifically, when the input analog signals VIp and VIn are located at the reference level VREF serving as the operating point of the error integrator 110, in the error integrator 110, the input level V1 of the positive phase input end 111p is equal to a voltage $\{(R14+R15)/(R11+R12+R13+R14+R15)\}$VREF obtained by voltage dividing of the difference voltage (=VREF) between the voltage VIp (=VREF) and the voltage VOn (=0 V; ground voltage) based on a ratio between the resistors R11, R12 and R13 and the resistors R14 and R15. Similarly, the input level V2 of the negative phase input end 111n of the error integrator 110 is equal to a voltage $\{(R24+R25)/(R21+R22+R23+R24+R25)\}$VREF=$\{(R14+R15)/(R11+R12+R13+R14+R15)\}$VREF=V1 obtained by voltage dividing of the difference voltage (=VREF) between the voltage VIn (=VREF) and the voltage VOp (=0 V; ground voltage) based on a ratio between the resistors R21, R22 and R23 and the resistors R24 and R25. Then, in a state that the input analog signals VIp and VIn oscillate in mutually negative phases with respect to the reference level VREF and that the amplitudes of the input analog signals VIp and VIn are small and hence the integrated value signals VDp and VDn are not clamped, as shown in FIG. 8, the input levels V1 and V2 of the error integrator 110 are maintained at the same level with each other and oscillate in the high potential direction from the voltage $\{(R14+R15)/(R11+R12+R13+R14+R15)\}$VREF by a voltage corresponding to the amplitudes of the input analog signals VIp and VIn.

Nevertheless, when the integrated value signal VDp or VDn is clamped by the clamping circuit 120, a feedback signal having a level corresponding to the input signal to the error integrator 110 is not fed back to the input side of the error integrator 110. Thus, the level of the input signal becomes excessive in comparison with the feedback signal. Accordingly, as shown in FIG. 8, a level difference corresponding to the amount of distortion in the load drive waveforms caused by clamping occurs between the input level V1 and the input level V2 at each time when clamping is performed by the clamping circuit 120.

The output limit instruction generating section 310A outputs the output limit instruction signal Cdet when clamping is performed by the clamping circuit 120 so that distortion of a certain amount occurs in the load drive waveforms such that the level difference between the input level V1 and the input level V2 exceeds a fixed threshold value.

In this embodiment, the output limit instruction generating section 310A has a configuration that in the first embodiment, the comparators 311 and 312 of the output limit instruction generating section 310 are replaced by comparators 311A and 312A. Here, the comparators 311A and 312A receive an offset voltage Vofs (corresponding to the threshold value) between the positive phase input end and the negative phase input end. Then, in the comparator 311A, the voltage V1 is supplied to the positive phase input end, and the voltage V2 is supplied to the negative phase input end. Then, when the voltage V1 at the positive phase input end is higher than the voltage V2 at the negative phase input end by an amount greater than or equal to the offset voltage Vofs, a signal of H level is output. Then, in the comparator 312A, the voltage V2 is supplied to the positive phase input end, and the voltage V1 is supplied to the negative phase input end. Then, when the voltage V2 at the positive phase input end is higher than the voltage V1 at the negative phase input end by an amount greater than or equal to the offset voltage Vofs, a signal of H level is output. Then, when the output signal of the comparator 311A or the output signal of the comparator 312A is at the H level, that is, when the clamping circuit 120 clamps the integrated value signal VDp or VDn and distortion of a certain amount occurs in the load drive waveforms so that |V1−V2| exceeds the offset voltage Vofs as shown in FIG. 8, the OR gate 313 brings the output limit instruction signal Cdet to an H level (active level).

The attenuation instruction pulse generating section 320 and the mute control section 330 are similar to those in the first embodiment. Description of details of the configuration of the class-D amplifier according to this embodiment is completed here.

In this embodiment, in a state that the integrated value signals VDp and VDn are not clamped by the clamping circuit 120, output digital signals VOp and VOn having pulse widths corresponding to the levels of the input analog signals VIp and VIn are obtained. Thus, balance is maintained between each input signal and each feedback signal in the error integrator 110. Thus, the error integrator 110 operates in a state that the level V1 of the positive phase input end and the level V2 of the negative phase input end are maintained at the same level. In this state, the output limit instruction signal Cdet is at an L level. Thus, in the attenuation instruction pulse generating section 320, the voltage VC1 on the capacitor C30 is at 0 V and hence the attenuation instruction pulses SW are not generated. Accordingly, the analog signals VIp' and VIn' appearing at the two ends of the attenuator 160 have waveforms of similarity obtained by multiplying the input analog signals VIp and VIn by a predetermined coefficient.

However, when the levels of the input analog signals VIp and VIn increase, the integrated value signals VDp and VDn output by the error integrator 110 reach the clamp levels LL and UL eventually so that the integrated value signals VDp and VDn are clamped by the clamping circuit 120. When the integrated value signals VDp and VDn are clamped by the clamping circuit 120, in the error integrator 110, the input signals become excessive in comparison with the feedback signals so that a level difference occurs between the level V1 of the positive phase input end and the level V2 of the negative phase input end. Then, at each time that clamping is performed by the clamping circuit 120 and the level difference |V1−V2| exceeds the offset voltage Vofs, the output limit instruction signal Cdet becomes an H level. Thus, in the attenuation instruction pulse generating section 320, the voltage VC1 on the capacitor C30 rises so that the attenuation instruction pulses SW are generated in synchronization with the individual peak points of the triangular wave signals TRp and TRn. As a result, during each period when the attenuation instruction pulse SW is at an L level, the analog signals VIp' and VIn' at the two ends of the attenuator 160 have signal values corresponding to the original input analog signals VIp and VIn, respectively. In contrast, during each period when the attenuation instruction signal SW is at an H level, the analog signals VIp' and VIn' are at 0 V. Thus, waveforms are obtained in which intermittent truncation is performed at fixed time intervals. Accordingly, the analog signals substantially input to the error integrator 110 are attenuated, and hence the integrated value signals VDp and VDn are reduced such that the amount of distortion should have a fixed value.

More specifically, in a situation that the amplitudes of the input analog signals VIp and VIn increase so that clamp operation is performed in which the amplitudes of the integrated value signals VDp and VDn are limited into the range from the lower limit clamp level LL to the upper limit clamp level UL, control equivalent to negative feedback is performed in which the pulse width of the attenuation instruction pulses SW is increased in accordance with an increase in the amplitudes of the input analog signals VIp and VIn so that the rate of intermittent truncation is increased and hence the overall gain of the class-D amplifier is reduced. As a result of such negative feedback control, the overall gain of the class-D amplifier is adjusted into an optimum value such that the pulse width modulation factor for the output digital signals VOp and VOn should fall within a particular upper limit. The upper limit of the pulse width modulation factor for the output digital signals VOp and VOn depends on the lower limit clamp level LL and the upper limit clamp level UL. This is because in the class-D amplifier according to this embodiment, the pulse width modulation factor for the output digital signals VOp and VOn is determined in accordance with the levels of the integrated value signals VDp and VDn output by the error integrator 110 and because when the integrated value signals VDp and VDn are to exceed the range from the lower limit clamp level LL to the upper limit clamp level UL, the integrated value signals VDp and VDn are clamped so that the attenuation instruction pulses SW for intermittent truncation are generated so as to suppress an increase in the levels of the integrated value signals VDp and VDn and an increase in the pulse width modulation factor associated with the increase in the levels.

The operation of the mute control section 330 is similar to that in the first embodiment. Thus, also in this embodiment, an effect similar to that in the first embodiment is obtained.

Third Embodiment

In a class-D amplifier, in a signal absence condition where no input signal is supplied from the preceding stage, noise (white noise, in many cases) generated by the preceding stage is amplified by the class-D amplifier and then supplied to a speaker serving as a load. Thus, uncomfortable sound is output from the speaker. An object of this embodiment is to avoid such a situation that noise from the preceding stage is amplified by the class-D amplifier in a signal absence condition. In order to achieve this object, a class-D amplifier according to this embodiment has a configuration that a signal absence detecting section 400 shown in FIG. 9 is added to the mute control section 330 of the class-D amplifier according to the first embodiment or the second embodiment.

Figure 9:
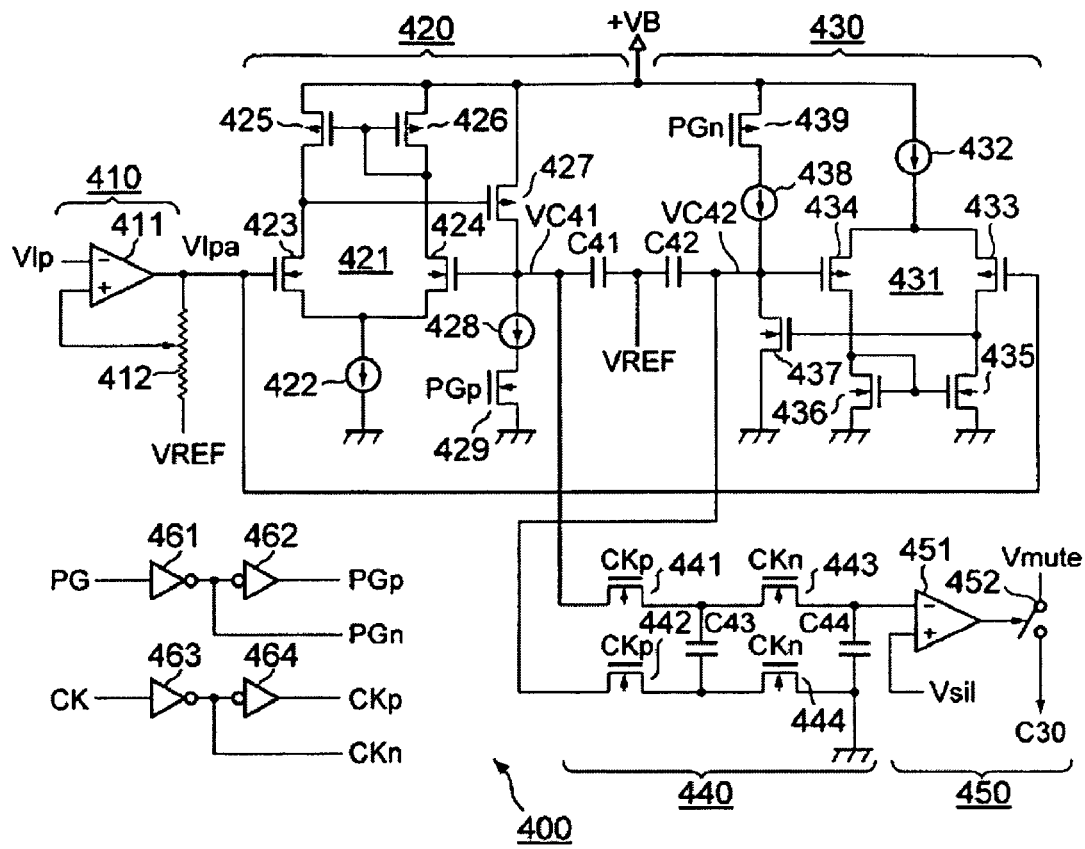
FIG. 9 is a circuit diagram showing a configuration of a signal absence detecting section 400 in a class-D amplifier according to a third embodiment of the invention.

The signal absence detecting section 400 shown in FIG. 9 detects the amplitude of input analog signal VIp, more specifically, the peak-to-peak voltage between the positive peak and the negative peak of the input analog signal VIp. Then, the signal absence detecting section 400 controls to increase the voltage VC1 on the capacitor C30 of the attenuation instruction pulse generating section 320 (see FIGS. 1 and 7) to the mute voltage Vmute where the pulse width of the attenuation instruction pulses SW goes to the maximum when the peak-to-peak voltage goes below a predetermined threshold value Vsi1.

In FIG. 9, the input amplifying section 410 is a circuit for amplifying the input analog signal VIp, and has a differential amplifier 411 and a variable resistor 412. The positive phase input terminal of the differential amplifier 411 receives the input analog signal VIp. The variable resistor 412 is provided between the output terminal of the differential amplifier 411 and a power supply of reference level VREF. The input analog signals VIp and VIn input to the class-D amplifier are balanced two-phase signals having symmetric waveforms with respect to the reference level VREF. In the input amplifying section 410, the voltage at the center tap of the variable resistor 412 is returned by negative feedback to the negative phase input terminal of the differential amplifier 411. In this embodiment, the center tap position of the variable resistor 412 is adjusted by operation of an operation element (not shown) so that the gain of the input amplifying section 410 is adjusted.

The output signal VIpa of the input amplifying section 410 is input to the peak hold circuits 420 and 430. Here, the peak hold circuit 420 is a circuit for holding a positive peak voltage that appears in the output signal VIpa of the input amplifying section 410. The peak hold circuit 430 is a circuit for holding a negative peak voltage that appears in the output signal VIpa of the input amplifying section 410.

The peak hold circuit 420 is described as follows. The differential amplifier 421 includes N-channel transistors 423 and 424 whose sources are connected to each other so that a differential transistor pair is formed; a constant current source 422 provided between the common source of this differential transistor pair and a grounding conductor; and P-channel transistors 425 and 426 each provided between the drain of the N-channel transistor 423 or 424 and the power supply +VB. Here, the gates of the P-channel transistors 425 and 426 are connected to the connection point between the drain of the 113 P-channel transistor 426 and the drain of the N-channel transistor 424.

In the differential transistor pair, the output signal VIpa of the input amplifying section 410 is supplied to the gate of the N-channel transistor 423. Then, the gate of the N-channel transistor 424 is connected to one electrode of the peak hold capacitor C41. Further, the other electrode of the capacitor C41 is fixed at the reference level VREF. Then, in the differential amplifier 421, when the output signal VIpa of the input amplifying section 410 is higher than the voltage VC41 on the electrode of the capacitor C41 connected to the gate of the N-channel transistor 424, the N-channel transistor 423 is turned ON and the N-channel transistor 424 is tuned OFF. On the contrary, when the output signal VIpa of the input amplifying section 410 is lower than the voltage VC41, the N-channel transistor 423 is turned OFF and the N-channel transistor 424 is turned ON.

In the P-channel transistor 427, a source thereof is connected to the power supply +VB, a gate thereof is connected to the drain of the N-channel transistor 423, and a drain thereof is connected to the connection point between the gate of the N-channel transistor 424 and the capacitor C41. Then, in the peak hold circuit 420, when the output signal VIpa of the input amplifying section 410 is higher than the voltage VC41 on the capacitor C41 and hence the N-channel transistor 423 is turned ON, the P-channel transistor 427 is turned ON and hence an attack operation is performed such that the voltage VC41 on the capacitor C41 is raised toward the voltage value of the output signal VIpa of the input amplifying section 410. As a result of the attack operation, the positive peak voltage of the output signal VIpa of the input amplifying section 410 is held on the capacitor C41.

The constant current source 428 and the N-channel transistor 429 are provided between the connection point between the gate of the N-channel transistor 424 and the capacitor C41 and the grounding conductor. Here, the gate of the N-channel transistor 429 receives a release clock PGp. Then, in the peak hold circuit 420, in parallel to the attack operation, a release operation, in which in response to a timing of the release clock PGp becoming an H level, the N-channel transistor 429 is turned ON so as to connect the constant current source 428 to the capacitor C41 so that the accumulated charge (positive charge) on the capacitor C41 is discharged and hence the voltage VC41 on the capacitor C41 falls toward the reference level VREF, is performed.

The peak hold circuit 430 is described as follows. The differential amplifier 431 includes P-channel transistors 433 and 434 whose sources are connected to each other so that a differential transistor pair is formed; a constant current source 432 provided between the common source of this differential transistor pair and the power supply +VB; and N-channel transistors 435 and 436 each provided between the drain of the P-channel transistor 433 or 434 and a grounding conductor. Here, the gates of the N-channel transistors 435 and 436 are connected to the connection point between the drain of the N-channel transistor 436 and the drain of the P-channel transistor 434.

In the differential transistor pair, the output signal VIpa of the input amplifying section 410 is supplied to the gate of the P-channel transistor 433. Then, the gate of the P-channel transistor 434 is connected to one electrode of the peak hold capacitor C42. Further, the other electrode of the capacitor C42 is fixed at the reference level VREF. The capacitor C42 has the same capacitance as the capacitor C41. Then, in the differential amplifier 431, when the output signal VIpa of the input amplifying section 410 is lower than the voltage VC42 on the electrode of the capacitor C42 connected to the gate of the P-channel transistor 434, the P-channel transistor 433 is turned ON and the P-channel transistor 434 is turned OFF. On the contrary, when the output signal VIpa of the input amplifying section 410 is higher than the voltage VC42, the P-channel transistor 433 is turned OFF and the P-channel transistor 434 is turned ON.

In the N-channel transistor 437, the source is grounded, the gate is connected to the drain of the P-channel transistor 433, and the drain is connected to the connection point between the gate of the P-channel transistor 434 and the capacitor C42. Then, in the peak hold circuit 430, when the voltage of the output signal VIpa of the input amplifying section 410 is lower than the voltage VC42 on the capacitor C42 and hence the P-channel transistor 433 is ON, the N-channel transistor 437 is ON and hence attack operation is performed such that the voltage VC42 on the capacitor C42 is reduced toward the voltage value of the output signal VIpa of the input amplifying section 410. As a result of the attack operation, the negative peak voltage of the output signal VIpa of the input amplifying section 410 is held on the capacitor C42.

The constant current source 438 and the P-channel transistor 439 are provided between the connection point between the gate of the P-channel transistor 434 and the capacitor C42 and the power supply +VB. Here, the gate of the P-channel transistor 439 receives a periodic release clock PGn. This release clock PGp and the release clock PGn are generated on the basis of a periodic release clock PG generated by a clock generating circuit (not shown). More specifically, in this embodiment, the inverter 461 inverts the level of the release clock PG so as to generate the release clock PGn. Then, the inverter 462 inverts the level of the release clock PGn so as to generate the release clock PGp. Then, in the peak hold circuit 430, in parallel to the attack operation, release operation is performed in which in response to the release clock PGn going to an L level, the P-channel transistor 439 is turned ON so as to connect the constant current source 438 to the capacitor C42 so that the accumulated charge (negative charge) on the capacitor C42 is discharged and hence the voltage VC42 on the capacitor C42 rises toward the reference level VREF.

Figure 10:
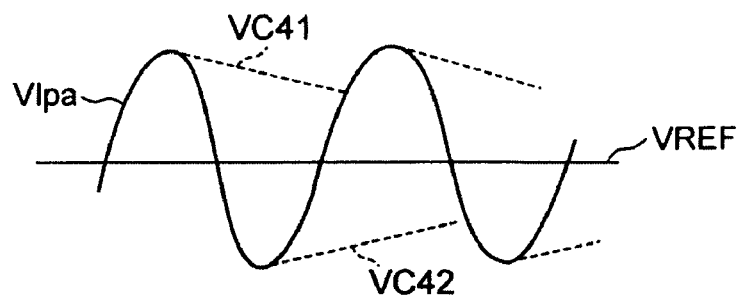
FIG. 10 is a waveform chart showing the situations of attack operation and release operation performed by a signal absence detecting section 400.

FIG. 10 is a waveform chart showing the situations of attack operation and release operation described here. As shown in FIG. 10, in the course that the output signal VIpa of the input amplifying section 410 rises and reaches a positive peak, attack operation is performed in which the voltage VC41 on the capacitor C41 is caused to follow the signal VIpa. In contrast, in the course that the output signal VIpa of the input amplifying section 410 falls and reaches a negative peak, attack operation is performed in which the voltage VC42 on the capacitor C42 is caused to follow the signal VIpa. Then, after the output signal VIpa of the input amplifying section 410 reaches a positive peak, in the course that the output signal VIpa falls, release operation is performed in which the voltage VC41 on the capacitor C41 falls toward the reference level VREF in accordance with a time constant determined by the capacitance of the capacitor C41, the frequency and the pulse width of the release clock PGp, and the current from the constant current source 428. Further, after the output signal VIpa of the input amplifying section 410 reaches a negative peak, in the course that the output signal VIpa rises, release operation is performed in which the voltage VC42 on the capacitor C42 rises toward the reference level VREF in accordance with a time constant determined by the capacitance of the capacitor C42, the frequency and the pulse width of the release clock PGn, and the current from the constant current source 438.

The voltage addition and transfer section 440 generates a voltage corresponding to the difference between the voltage VC41 of the electrode of the capacitor C41 connected to the gate of the N-channel transistor 424 and the voltage VC42 of the electrode of the capacitor C42 connected to the gate of the P-channel transistor 434 (or alternatively, the sum of the voltage between the two electrodes of the capacitor C41 and the voltage between the two electrodes of the capacitor C42), and then transfers the voltage to the level comparison section 450. The voltage addition and transfer section 440 includes N-channel transistors 441 to 444 and capacitors C43 and C44.

The N-channel transistor 441 is provided between the connection point between the capacitor C41 and the N-channel transistor 424 and one end of the capacitor C43. Further, the N-channel transistor 442 is provided between the connection point between the capacitor C42 and the P-channel transistor 434 and the other end of the capacitor C43. Here, the gates of the N-channel transistors 441 and 442 receive a periodic transfer clock CKp.

The N-channel transistor 443 is provided between one end of the capacitor C43 and one end of the capacitor C44. Further, the N-channel transistor 444 is provided between the other end of the capacitor C43 and the other end of the capacitor C44. Further, the other end of the capacitor C44 is grounded. Here, the gates of the N-channel transistors 443 and 444 receive a periodic transfer clock CKn.

This transfer clock CKn and the transfer clock CKp are generated on the basis of a periodic transfer clock CK generated by a clock generating circuit (not shown). More specifically, in this embodiment, the inverter 463 inverts the level of the transfer clock CK so as to generate the transfer clock CKn. Then, the inverter 464 inverts the level of the transfer clock CKn so as to generate the transfer clock CKp.

When the transfer clock CKp goes to an H level and the transfer clock CKn goes to an L level, in the voltage addition and transfer section 440, the N-channel transistors 441 and 442 are turned ON and the N-channel transistors 443 and 444 are turned OFF. Thus, the capacitors C41, C42, and C43 form a closed loop. As a result, the voltage on the capacitor C43 becomes a value corresponding to VC41−VREF+VREF−VC42=VC41−VC42 obtained by adding the voltage VC41−VREF between the two electrodes of the capacitor C41 and the voltage VREF−VC42 between the two electrodes of the capacitor C42 obtained before the formation of the closed loop, that is, a value corresponding to the peak-to-peak voltage between the positive peak and the negative peak of the input analog signal VIp.

Then, when the transfer clock CKp goes to an L level and the transfer clock CKn goes to an H level, in the voltage addition and transfer section 440, the N-channel transistors 441 and 442 are turned OFF and the N-channel transistors 443 and 444 are turned ON. Thus, the voltage on the capacitor C43 is transferred to the capacitor C44. As such, a voltage corresponding to the peak-to-peak voltage between the positive peak and the negative peak of the input analog signal VIp and measured with reference to the ground level is generated on the capacitor C44.

Figure 11:
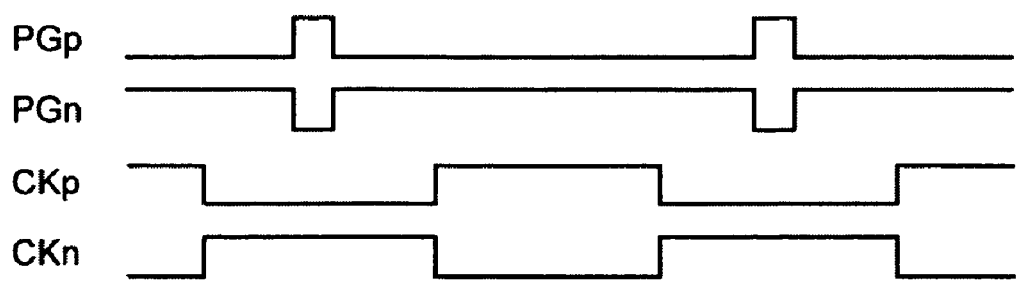
FIG. 11 is a diagram showing the waveforms of release clocks PGp and PGn and transfer clocks CKp and CKn in a signal absence detecting section 400.

FIG. 11 is a diagram showing the waveforms of the release clocks PGp and PGn and the transfer clocks CKp and CKn. As shown in the figure, the release clocks PGp and PGn and the transfer clocks CKp and CKn have the same frequency. During each period when the transfer clock CKp is at an L level and hence the N-channel transistors 441 and 442 are OFF, the release clocks PGp and PGn become an H level and an L level, respectively, and hence the P-channel transistor 429 and the N-channel transistor 439 become ON state.

The level comparison section 450 has a comparator 451 and a switch 452. Here, the switch 452 is provided between the power supply for generating the mute voltage Vmute and the capacitor C30 of the attenuation instruction pulse generating section 320. The comparator 451 compares the voltage on the capacitor C44 of the voltage addition and transfer section 440 with a predetermined threshold voltage Vsi1. Then, when the voltage on the capacitor C44 goes lower than the threshold voltage Vsi1, the switch 452 is turned ON so that the mute voltage Vmute is supplied to the capacitor C30. Here, the voltage value of the threshold voltage Vsi1 is determined on the basis of the upper limit of the level range for the input analog signal VIp where the input signal is regarded as absent.

According to this embodiment, when the peak-to-peak voltage of the input analog signal VIp falls into the range where the input signal is regarded as absent, the mute voltage Vmute is supplied to the capacitor C30 of the attenuation instruction pulse generating section 320. Thus, the attenuator 160 serving as the switch becomes continuously ON, and hence no signal is input to the error integrator 110. According to this embodiment, in a signal absence condition where no input signal is supplied from the preceding stage, the gain of the class-D amplifier is automatically lowered to the minimum. This operation avoids a situation that noise caused by the preceding stage generates uncomfortable sound and then the sound is output from the speaker. Further, according to this embodiment, the peak-to-peak voltage between the positive peak and the negative peak of the input analog signal VIp is detected, and then on the basis of this peak-to-peak voltage, it is judged whether the input analog signal VIp has fallen into a range where the input signal is regarded as absent. Thus, without an influence that the input analog signal VIp is affected by drift in the reference level VREF, information indicating the amplitude of the input analog signal VIp can be acquired accurately. Also, the appropriate mute control can be performed.

Figure 12:
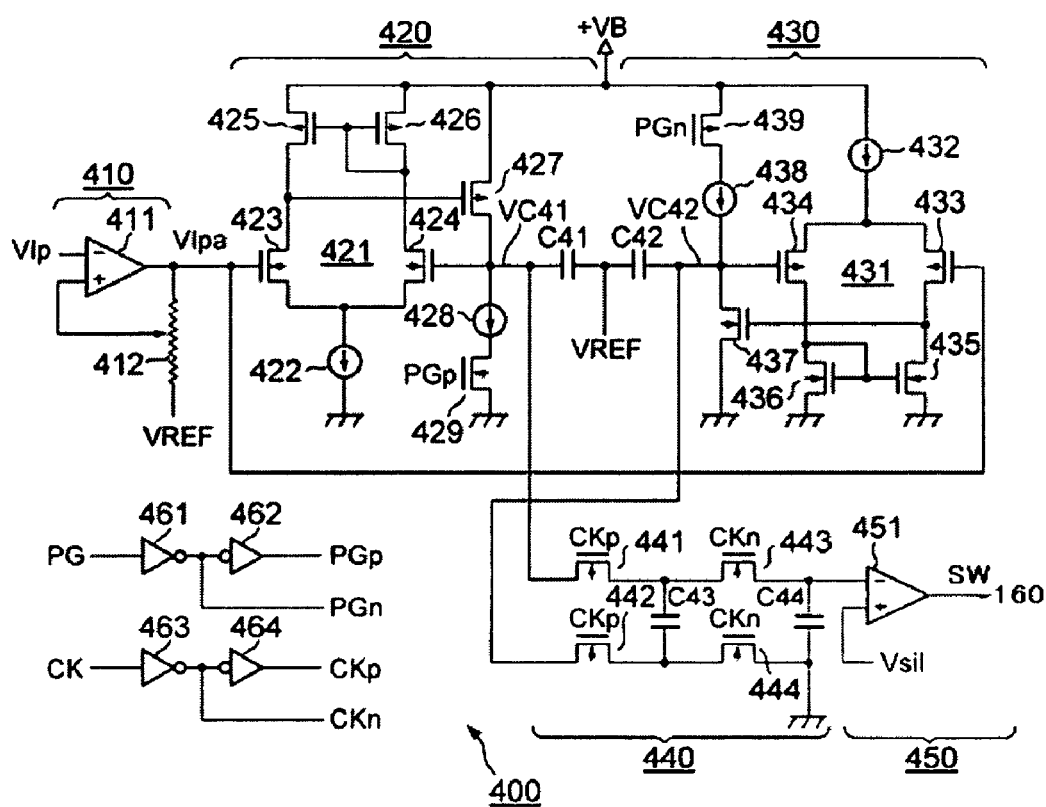
FIG. 12 is a circuit diagram showing a configuration of a signal absence detecting section 400 in a class-D amplifier according to a modification of the third embodiment of the invention.

In this embodiment, the class-D amplifier has the configuration that the signal absence detecting section 400 shown in FIG. 9 is added to the mute control section 330 of the class-D amplifier according to the first embodiment or the second embodiment. However, the class-D amplifier may have a configuration that the signal absence detecting section 400 shown in FIG. 9 is added to and the attenuation control section 300 is omitted from the class-D amplifier according to the first embodiment or the second embodiment. In this configuration, as shown in FIG. 12, an output signal of the comparator 451 is directly supplied to the attenuator 160 as the attenuation instruction pulse SW to turn ON the attenuator 160. In this modification, since the peak-to-peak voltage of the input analog signal VIp is set to a fully small value regarded as no signal, there is no occurrence of a problem, such as popping sound at the time of switching from ON state to OFF state of the attenuator 160 or in reverse of order of the switching of the attenuator 160.

In this modification, the attenuation control section 300 is omitted from the class-D amplifier. Therefore, the mute can be achieved more quickly since it is no need to set an attack time and a release time for charging and discharging the capacitor in the attenuation control section 300.

Other Embodiments

Embodiments of the invention have been described so far. However, the invention may be implemented in other embodiments of various kinds as follows.

(1) In the second embodiment, the levels of the integrated value signals VDp and VDn output by the error integrator 110 have been limited so that the power values of the output digital signals VOp and VOn have been limited. Instead, the pulse widths of the pulses VOp' and VOn' supplied from the pulse width modulation circuit 130 to the predriver 140 may be limited so that the power values of the output digital signals VOp and VOn may be limited. Also in this case, when the pulse widths of the pulses VOp' and VOn' are limited, distortion occurs in the load drive waveforms similarly to the case that the integrated value signal VDp or VDn is clamped. Thus, a level difference corresponding to the amount of distortion of the load drive waveforms occurs between the input level V1 and the input levels V2 of the error integrator 110. Thus, the output limit instruction generating section 310A similar to that in the second embodiment generates the output limit instruction signal Cdet so as to limit the power values of the output digital signals VOp and VOn.

(2) In the first and the second embodiments, the voltage VC1 on the capacitor C30 serving as an integrator has been increased in response to generating of a mute instruction, while the voltage VC1 has been reduced in response to generating of a mute release instruction. However, another mode of controlling the voltage VC1 may be employed. For example, at the time of power-ON of the class-D amplifier, the voltage VC1 on the capacitor C30 may be set to the voltage at the center between the upper and the lower peaks of the triangular wave signals TRp and TRn or more. Then, attenuation instruction pulses SW having the maximum pulse width (that is, a signal continuously is maintained at an H level) may be generated. After that, when a predetermined time has elapsed, the voltage VC1 may gradually be reduced to 0 V. This mode avoids occurrence of popping sound at the time of power-ON of the class-D amplifier.

(3) The embodiments given above have been described for a case that the invention is applied to a class-D amplifier of balance type having a differential configuration. However, obviously, the invention may similarly be applied to a class-D amplifier of non-balance type not having a differential configuration.

Here, the details of the above embodiments are summarized as follows. A class-D amplifier for generating from an input signal a digital signal for driving a load, includes an output limit instruction generating section that detects that the digital signal falls outside a limit range and that outputs an output limit instruction signal; an attenuation instruction pulse generating section that includes an integrator for integrating the output limit instruction signal and that outputs a periodical attenuation instruction pulse having pulse width corresponding to an integrated value in the integrator; an attenuating section provided in an input path for the input signal and that attenuates the input signal based on the attenuation instruction pulse; and a mute control section that controls the integrated value in the integrator independently of the output limit instruction signal to control an amount of the attenuation of the attenuating section applied to the input signal.

Here, the expression "the digital signal falls outside a limit range" corresponds, for example, to a clipped state or a state that the digital signal exceeds a predetermined upper power limit. In the invention, the output limit instruction generating section detects such situation that "the digital signal falls outside a limit range", and then outputs an output limit instruction signal. Then, the integrator integrates the output limit instruction signal. After that, the attenuation instruction pulse generating section outputs a periodical attenuation instruction pulse having a pulse width corresponding to the integrated value in the integrator, and thereby controlling the attenuating section to attenuate the input signal intermittently. Thus, for example, when the digital signal becomes the clipped state or the state that the digital signal exceeds a predetermined upper power limit, negative feedback control is performed so as to expand or broaden the pulse width of the attenuation instruction pulse for attenuating the input signal. As a result, this negative feedback control avoids that the digital signal goes into the clipped state. Alternatively, the power of the digital signal is limited within the upper power limit. On the other hand, the mute control section controls the integrated value in the integrator independently of the output limit instruction signal. This permits the control of the pulse width of the attenuation instruction pulse output from the attenuation instruction pulse generating section, so that mute is achieved. Thus, according to the invention, the integrator, the attenuation instruction pulse generating section, and the attenuating section provided for avoiding the clipped state or the like in the class-D amplifier are utilized for the mute control. Accordingly, a mute function is realized without an increase in the circuit size and in the control complexity.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japanese Patent Application No. 2009-213806 filed on Sep. 15, 2009, the contents of which are incorporated herein by reference.

What is claimed is:

1. A class-D amplifier for generating from an input signal a digital signal for driving a load, comprising:
an output limit instruction generating section that detects that the digital signal falls outside a limit range and that outputs an output limit instruction signal;
an attenuation instruction pulse generating section that includes an integrator for integrating the output limit instruction signal and that outputs a periodical attenuation instruction pulse having a pulse width corresponding to an integrated value in the integrator;
an attenuating section provided in an input path for the input signal and that attenuates the input signal based on the attenuation instruction pulse; and
a mute control section that controls the integrated value in the integrator independently of the output limit instruction signal to control an amount of the attenuation of the attenuating section applied to the input signal.

2. The class-D amplifier according to claim 1, wherein when a mute instruction is input to the mute control section, the mute control section increases the integrated value in the integrator gradually.

3. The class-D amplifier according to claim 2, wherein when a mute release instruction is input to the mute control section after the mute instruction has been input thereto, the mute control section decreases the integrated value in the integrator gradually.

4. The class-D amplifier according to claim 1, wherein the mute control section includes a signal absence detecting section; and
wherein the signal absence detecting section increases the integrated value in the integrator when an amplitude of the input signal is equal to or smaller than a predetermined level.

5. The class-D amplifier according to claim 1, wherein the mute control section includes a signal absence detection section; and
wherein the signal absence detecting section outputs to the attenuating section a command signal for controlling the amount of the attenuation of the attenuating section applied to the input signal, when an amplitude of the input signal is equal to or smaller than a predetermined level.

6. A class-D amplifier for generating from an input signal a digital signal for driving a load, comprising:
an output limit instruction generating section that detects that the digital signal falls outside a limit range and that outputs an output limit instruction signal;
a detecting section that detects an amplitude of the input signal;
a signal absence detecting section that outputs an attenuation instruction signal when the amplitude of the input signal is equal to or smaller than a predetermined level; and
an attenuating section provided in an input path for the input signal and that attenuates the input signal both in a first case that the output limit instruction generating section outputs the output limit instruction signal and in a second case that the signal absence detecting section outputs the attenuation instruction signal.

7. The class-D amplifier according to claim 6, wherein the attenuating section periodically and intermittently attenuates the input signal.

* * * * *